US010439515B2

(12) United States Patent
Miyake (10) Patent No.: US 10,439,515 B2
(45) Date of Patent: Oct. 8, 2019

(54) POWER CONVERSION DEVICE

(71) Applicant: TOYOTA JIDOSHA KABUSHIKI KAISHA, Toyota-shi (JP)

(72) Inventor: Hiroki Miyake, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/244,271

(22) Filed: Jan. 10, 2019

(65) Prior Publication Data

US 2019/0229644 A1 Jul. 25, 2019

(30) Foreign Application Priority Data

Jan. 25, 2018 (JP) ................................. 2018-010495

(51) Int. Cl.
*H02M 7/5387* (2007.01)
*H02M 3/335* (2006.01)
*H02P 27/06* (2006.01)
*H03K 17/0412* (2006.01)
*H02M 1/00* (2006.01)

(52) U.S. Cl.
CPC ..... *H02M 7/5387* (2013.01); *H02M 3/33569* (2013.01); *H02P 27/06* (2013.01); *H03K 17/04123* (2013.01); *H02M 2001/0006* (2013.01)

(58) Field of Classification Search
CPC .. H02M 3/335; H02M 3/33569; H02M 7/537; H02M 7/5387; H02M 7/5388; H02M 2001/0006; H02P 27/04; H02P 27/06; H03K 17/0412
See application file for complete search history.

(56) References Cited

U.S. PATENT DOCUMENTS

| 9,766,827 | B1 * | 9/2017 | Meinerzhagen | ....... G11C 5/148 |
| 2014/0167721 | A1 * | 6/2014 | Ito | ........................... H02M 1/08 323/282 |
| 2014/0185346 | A1 * | 7/2014 | Liu | ...................... H03K 17/127 363/131 |

FOREIGN PATENT DOCUMENTS

JP    2014-27816    2/2014

* cited by examiner

*Primary Examiner* — Matthew V Nguyen
(74) *Attorney, Agent, or Firm* — Oblon, McClelland, Maier & Neustadt, L.L.P.

(57) ABSTRACT

A power conversion device includes a first switching element configured by using a first semiconductor material and a second switching element connected in parallel with the first switching element and configured by using a second semiconductor material having a band gap narrower than that of the first semiconductor material. The power conversion device further includes a control device configured to selectively execute any one of first switching control and second switching control of intermittently turning on the first switching element and the second switching element, respectively, according to a current command value. A size of the first switching element is smaller than a size of the second switching element. The control device selects the first switching control if the current command value is smaller than a first threshold value and selects the second switching control if the current command value is larger than a second threshold value.

11 Claims, 7 Drawing Sheets

POWER CONVERSION DEVICE

INCORPORATION BY REFERENCE

The disclosure of Japanese Patent Application No. 2018-010495 filed on Jan. 25, 2018 including the specification, drawings and abstract is incorporated herein by reference in its entirety.

BACKGROUND

1. Technical Field

The technology disclosed in this specification relates to a power conversion device.

2. Description of Related Art

There is known a power conversion device that performs power conversion between a power source and a load, such as a DC-DC converter and an inverter. In this type of the power conversion device, the power source and the load are connected through one or a plurality of switching elements, and for example, by performing Pulse Width Modulation (PWM) control on each switching element, power conversion is performed between the power source and the load.

For example, an inverter is disclosed in Japanese Patent Application Publication No. 2014-27816 (JP 2014-27816 A). In this inverter, two switching elements connected in parallel are employed, and one of the two switching elements is preferentially operated according to a current flowing in these switching elements. One switching element is an Insulated Gate Bipolar Transistor (IGBT), and the other switching element is a Metal-Oxide Semiconductor Field Effect Transistor (MOSFET). With respect to a semiconductor material constituting the MOSFET, it has been proposed to employ silicon carbide (SiC).

SUMMARY

Silicon carbide has a wider band gap than silicon, and such a semiconductor material is called a wide band gap semiconductor. Although the wide band gap semiconductor is superior to silicon in terms of performance, the wide band gap semiconductor has a problem of being relatively expensive. Therefore, in the inverter disclosed in JP 2014-27816 A, a wide band gap semiconductor is employed for only one of the two switching elements. Such a configuration can achieve both improvement in performance and reduction of cost of the power conversion device, but there is still room for improvement.

Therefore, the present specification provides a new technology that can achieve both improvement in performance and reduction of production cost of a power conversion device.

A first aspect of the disclosure relates a power conversion device that performs power conversion between a power source and a load. This power conversion device includes a first switching element provided on a power supply path from the power source to the load and configured by using a first semiconductor material and a second switching element connected in parallel with the first switching element and configured by using a second semiconductor material having a band gap narrower than that of the first semiconductor material. The power conversion device further includes a control device that selectively executes first switching control for intermittently turning on the first switching element according to a current command value and second switching control for intermittently turning on the second switching element according to the current command value. The size of the first switching element is smaller than the size of the second switching element. Then, the control device selects the first switching control if the current command value is smaller than a first threshold value and selects the second switching control if the current command value is larger than a second threshold value.

In the above-described power conversion device, the size of the first switching element is allowed to be smaller than the size of the second semiconductor element, and a semiconductor material having a wide band gap (hereinafter, referred to as a wide band gap semiconductor) is employed for the first switching element. In general, the production cost of the switching element increases in proportion to the size thereof, and the tendency thereof becomes remarkable in the switching element employing the wide band gap semiconductor. Therefore, with respect to the first switching element employing the wide band gap semiconductor, the production cost of the power conversion device can be significantly reduced by reducing the size.

On the other hand, as the size of the first switching element is reduced, the rated current of the first switching element also decreases. Therefore, in the above-described power conversion device, the first switching control for operating the first switching element and the second switching control for operating the second switching element are selectively executed according to the current command value. As a result, by operating the first switching element only if the current command value is relatively small, an excessive current flowing in the first switching element is suppressed. In general, in many cases, the period during which the power conversion device operates with a large current command value is short, and the first switching control is more selected than the second switching control. Therefore, even in a case where the first switching element is operated only if the current command value is relatively small, the use frequency of the first switching element becomes relatively high, so that the merit of employing a wide band gap semiconductor can be obtained sufficiently.

Herein, in a power conversion device such as a DC-DC converter or an inverter, an actually flowing current (so-called an instantaneous current) greatly fluctuates during one period of switching control (for example, one period of carrier frequency in PWM control). Under such circumstances, if the selection between the first switching control and the second switching control is performed on the basis of the instantaneous current flowing in the power conversion device, there is a concern that switching of the switching control may occur frequently. In this case, the total number of times of switching of the first switching element and the second switching element increases, which causes a problem of energy loss accompanied with the switching. In addition, since the number of times of fluctuation of temperature of the first switching element and the second switching element increases, fatigue of the first switching element and the second switching element caused by a thermal history also increases. Therefore, in the power conversion device according to the present embodiment, the selection between the first switching control and the second switching control is performed on the basis of not the instantaneous current but the current command value (for example, a target value of an effective current in the case of an inverter and a target value of an average current in the case of a DC-DC converter). As a result, excessive switching of switching control is avoided, so that the energy loss accompanied with the switching is suppressed.

In the first aspect of the disclosure, a control device may execute selection of first switching control or second switching control in units of one or a plurality of periods of the switching control. With such a configuration, it is possible to prohibit switching of switching elements to be turned on during one period of the switching control. As a result, an increase in the total number of times of switching of a first switching element and a second switching element is avoided, so that it is possible to suppress energy loss accompanied with the switching. In addition, since fluctuation of temperatures of the first switching element and the second switching element is suppressed, fatigue of the first switching element and the second switching element caused by a thermal history is also reduced.

In the first aspect of the disclosure, the first threshold value and the second threshold value may have the same value. Alternatively, as an another aspect, the second threshold value may be larger than the first threshold value. In this case, when executing the first switching control, the control device may proceed to the second switching control if the current command value exceeds the second threshold value. In addition, when executing the second switching control, the control device may proceed to the first switching control if the current command value falls below the first threshold value. In this manner, so-called hysteresis may be provided for the switching between the first switching control and the second switching control.

In the first aspect of the disclosure, the control device may change at least one of the first threshold value and the second threshold value according to a temperature of at least one of the first switching element and the second switching element. With such a configuration, it is possible to appropriately perform the switching between the first switching control and the second switching control while preventing overheating of the first switching element and the second switching element.

In the first aspect of the disclosure, in the first switching control, the PWM control may be performed on the first switching element at the first carrier frequency, and in the second switching control, the PWM control may be performed on the second switching element at the second carrier frequency. However, as an another aspect, in the first switching control, Pulse Frequency Modulation (PFM) control may be performed on the first switching element, and in the second switching control, the PFM control may be performed on the second switching element.

In the first aspect of the disclosure, the first carrier frequency in the first switching control and the second carrier frequency in the second switching control may have the same value. With such a configuration, the control structure of the control device can be made relatively simple. However, as another aspect, the first carrier frequency and the second carrier frequency may be different from each other. In addition, at least one of the first carrier frequency and the second carrier frequency may be changed according to various indices.

In the first aspect of the disclosure, the power conversion device may include an inverter that outputs an AC (alternating current) power. In this case, the control device may change at least one of the first carrier frequency and the second carrier frequency according to an output frequency of the AC power. With such a configuration, when the output frequency of the AC power is relatively low, by decreasing the first carrier frequency or the second carrier frequency, it is possible to suppress the switching loss. On the other hand, when the output frequency of the AC power is relatively high, by increasing the first carrier frequency or the second carrier frequency, it is possible to output an AC power having a smooth waveform.

In the first aspect of the disclosure, the power conversion device may be an inverter that outputs an AC power. In this case, when an output frequency of the AC power is less than a predetermined lower limit value, the control device may select the second switching control even if the current command value is smaller than the first threshold value. When the output frequency of the AC power is small, the current flowing in the switching element also gently changes, so that the temperature of the switching element tends to greatly fluctuate. In this case, even if the current command value (that is, the effective value of the current) is relatively small, the temperature of the switching element sometimes reaches a high temperature. Therefore, when the output frequency of the AC power is relatively small, the second switching control may be selected irrespective of the current command value to prohibit the operation of the first switching element having a small size.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A power conversion device 10 according to the embodiment will be described with reference to the drawings. As an example, the power conversion device 10 according to the present embodiment is mounted on a car such as a hybrid car, a fuel cell car, or an electric car and performs power conversion between a battery 2 and a motor 4 that drives the wheels. However, the technique disclosed in the present embodiment can be employed not only for the power conversion device 10 mounted in a car, but also for a power conversion device for various uses.

The motor 4 may function as an electric motor or may function as an electric generator. When the motor 4 functions as an electric motor, power is supplied from the battery 2 to the motor 4 through the power conversion device 10. In this case, the battery 2 serves as a power source, and the motor 4 serves as a load. On the other hand, when the motor 4 functions as an electric motor, power is supplied from the motor 4 to the battery 2 through the power conversion device 10. In this case, the motor 4 serves as a power source, and the battery 2 serves as a load.

Figure 1:
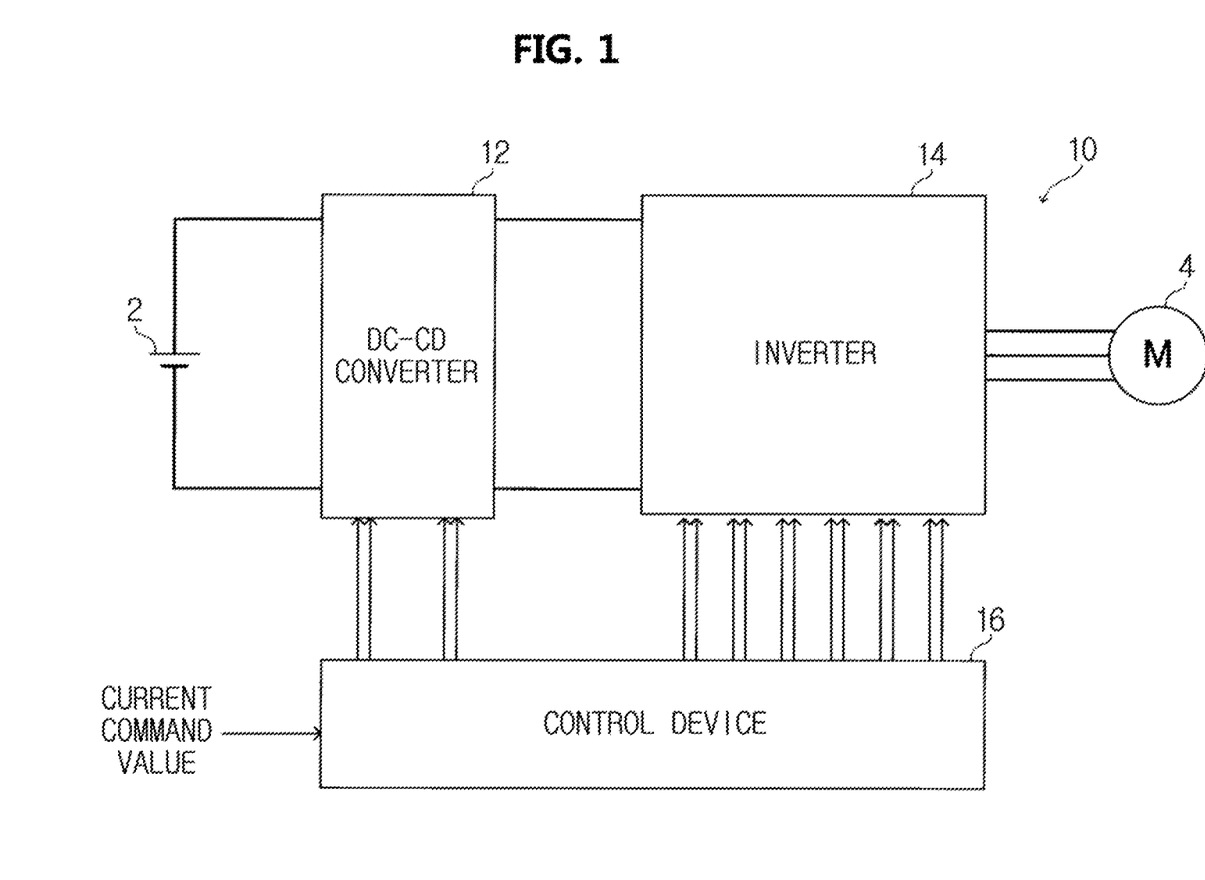
FIG. 1 is a block diagram illustrating a configuration of a power conversion device.

As illustrated in FIG. 1, the power conversion device 10 includes a DC-DC converter 12, an inverter 14, and a control device 16. The DC-DC converter 12 is provided between the battery 2 and the inverter 14. The DC-DC converter 12 is a step-up/down type DC-DC converter that can step up and down the DC power between the battery 2 and the inverter 14. The inverter 14 is provided between the DC-DC converter 12 and the motor 4. The inverter 14 is a three-phase inverter capable of converting a DC power to three-phase AC (alternating current) power and vice versa between the DC-DC converter 12 and the motor 4.

For example, in a case where the motor 4 functions as an electric motor, the DC power supplied from the battery 2 is stepped up in the DC-DC converter 12, further converted into three-phase AC power in the inverter 14, and then supplied to the motor 4. As a result, the three-phase AC type motor 4 is driven by the DC power supplied from the battery 2. On the other hand, when the motor 4 functions as an electric generator, the three-phase AC power supplied from the motor 4 is converted into DC power by the inverter 14, further stepped down by the DC-DC converter 12, then supplied to the battery 2. As a result, the electric power generated by the motor 4 is charged into the battery 2.

Figure 2:
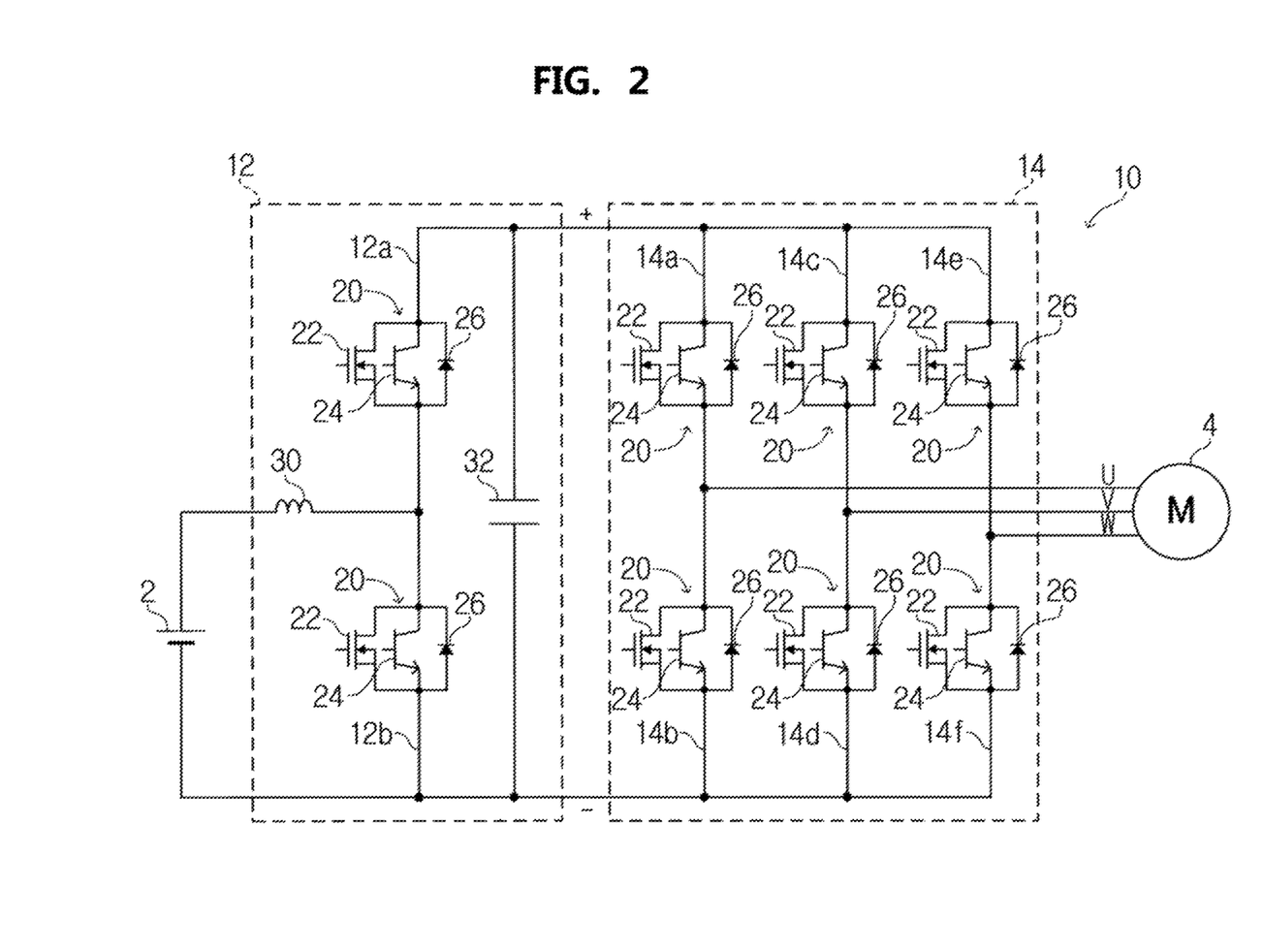
FIG. 2 is a circuit diagram illustrating an example of a circuit structure of a power conversion device.

FIG. 2 illustrates an example of a circuit structure of the DC-DC converter 12 and the inverter 14. As illustrated in FIG. 2, the DC-DC converter 12 and the inverter 14 are configured by using a plurality of switching circuits 20. Each of the switching circuits 20 is provided on a power supply path between the battery 2 and the motor 4, and the operation of the switching circuit is controlled by the control device 16. Each of the switching circuit 20 includes a first switching element 22, a second switching element 24, and a diode 26. The configuration of the switching circuit 20 will be described in detail later.

Except for the configuration of the switching circuit 20, other configurations of the DC-DC converter 12 and the inverter 14 are common to known DC-DC converters and inverters. For example, the DC-DC converter 12 has two switching circuits 20, an inductor 30, and a smoothing capacitor 32. One switching circuit 20 is provided in an upper arm 12a of the DC-DC converter 12, and the other switching circuit 20 is provided in a lower arm 12b of the DC-DC converter 12. The inverter 14 has six switching circuits 20. The switching circuits 20 are provided to a U-phase upper arm 14a, a U-phase lower arm 14b, a V-phase upper arm 14c, a V-phase lower arm 14d, a W-phase upper arm 14e, and a W-phase lower arm 14f, respectively. The configurations of the DC-DC converter 12 and the inverter 14 described herein are mere examples and can be appropriately changed. In addition, as another embodiment, the power conversion device 10 may include only the DC-DC converter 12, or may include only the inverter 14. In addition, the power conversion device 10 may be a step-up type (or step-down type) DC-DC converter, and in this case, only one switching circuit 20 may be provided.

As described above, each of the switching circuits 20 includes the first switching element 22 and the second switching element 24. The first switching element 22 is a MOSFET configured by using silicon carbide (SiC), and the second switching element 24 is an IGBT configured by using silicon (Si). Silicon carbide has a wider band gap than silicon, and thus, silicon carbide is called a wide band gap semiconductor. In addition, silicon carbide is an example of the first semiconductor material in the present technology, and silicon is an example of the second semiconductor material in the present technology. The first semiconductor material employed for the first switching element 22 is not limited to silicon carbide, but other wide band gap semiconductors such as gallium nitride (GaN), gallium oxide ($Ga_2O_3$), and diamond may be used. In addition, the second semiconductor material employed for the second switching element 24 is not limited to silicon carbide. The first semiconductor material employed for the first switching element 22 may have a wider band gap than the second semiconductor material employed for the second switching element 24. In addition, the first switching element 22 is not necessarily limited to a MOSFET, and the second switching element 24 is not necessarily limited to an IGBT.

Figure 3:
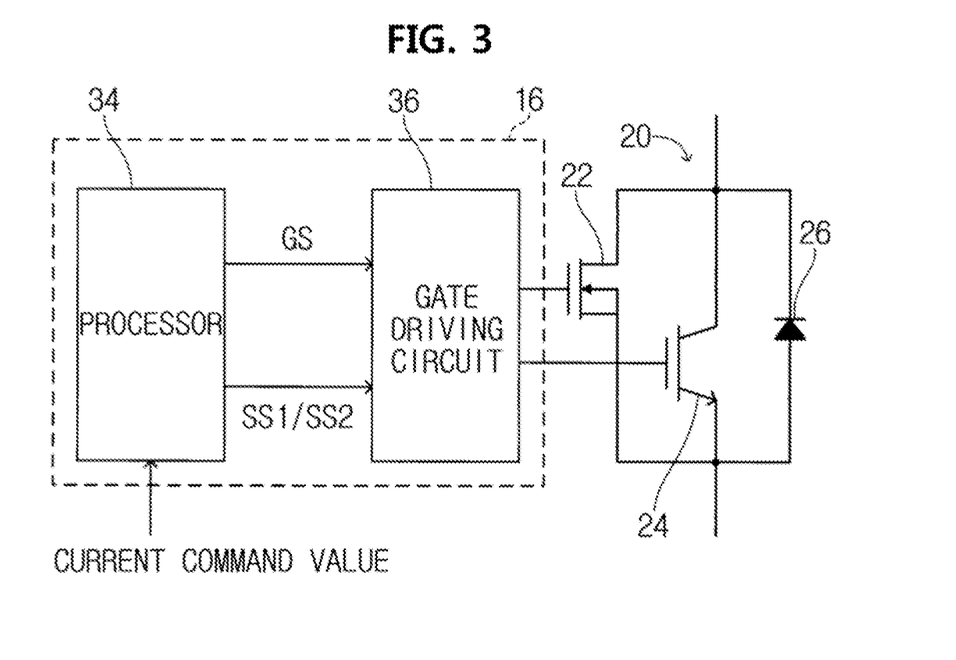
FIG. 3 is a block diagram illustrating an example of a configuration of a control device.

As illustrated in FIG. 3, the first switching element 22 and the second switching element 24 are connected to the control device 16 and are controlled by the control device 16, respectively. For example, the control device 16 can selectively execute the first switching control for performing the PWM control on the first switching element 22 and the second switching control for performing the PWM control on the second switching element 24 according to the current command value input from an electronic control unit of a car. The current command value referred to herein includes a current command value for the DC-DC converter 12 and a current command value for the inverter 14. The current command value for the DC-DC converter 12 is an average current of DC power to be output by the DC-DC converter 12. The current command value for the inverter 14 is an effective current of AC power to be output by the inverter 14. The first switching element 22 and the second switching element 24 of the two switching circuits 20 provided in the DC-DC converter 12 are controlled according to the current command value for the DC-DC converter 12. On the other hand, the first switching element 22 and the second switching element 24 of the six switching circuits 20 provided in the inverter 14 are controlled according to the current command value for the inverter 14.

As an example, the control device 16 according to the present embodiment includes a processor 34 and a gate driving circuit 36. A current command value is input to the processor 34. The processor 34 outputs a gate driving signal GS and a selection signal SS1 or SS2 to the gate driving circuit 36 according to the input current command value. The gate driving circuit 36 executes one of the first switching control and the second switching control according to the gate driving signal GS and the selection signal SS1 or SS2. For example, when the processor 34 is outputting the selection signal SS1, the gate driving circuit 36 performs the PWM control on the first switching element 22 on the basis of the gate driving signal GS. On the other hand, when the processor 34 is outputting the selection signal SS2, the gate driving circuit 36 performs the PWM control on the second switching element 24 on the basis of the gate driving signal GS. That is, when the processor 34 outputs the selection signal SS1, the first switching control is executed, and when the processor 34 outputs the selection signal SS2, the second switching control is executed.

Figure 4:
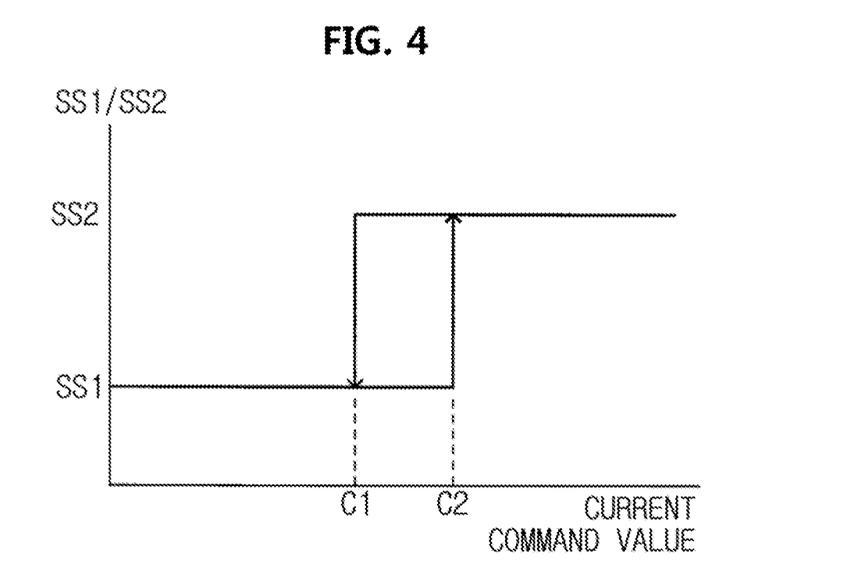
FIG. 4 is a graph showing a relationship between selection signals and a first threshold value and a second threshold value of a current command value.

As shown in FIG. 4, if the current command value is smaller than the first threshold value C1, the processor 34 outputs the selection signal SS1 instructing the first switching control, and if the current command value is larger than the second threshold value C2, the processor 34 outputs the selection signal SS2 instructing the second switching control. Herein, the second threshold value C2 is larger than the first threshold value C1, and hysteresis is provided between the first threshold value C1 and the second threshold value C2. That is, while the first switching control is being executed, the selection signal is switched from SS1 to SS2 if the current command value exceeds the second threshold value C2, and while the second switching control is being executed, the selection signal is switched from SS2 to SS1 if the current command value falls below the first threshold value C1. In addition, such hysteresis is not always necessary, and the first threshold value C1 and the second threshold value C2 may have the same value.

Figure 5:
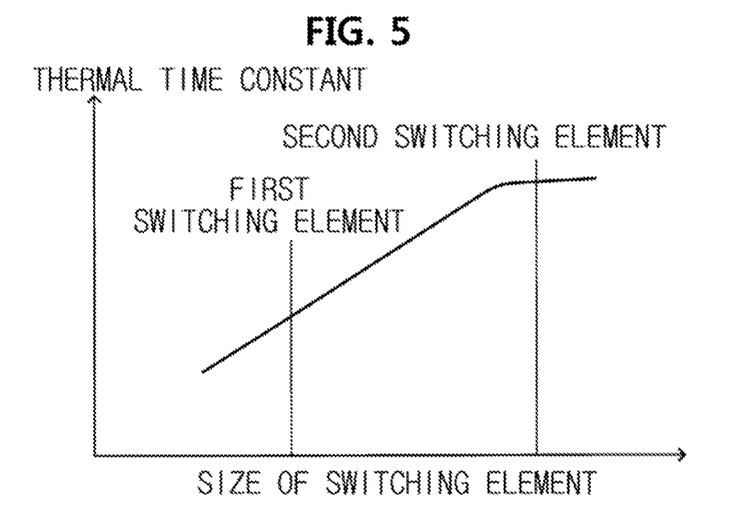
FIG. 5 is a graph showing a relationship between sizes and thermal time constants of switching elements.

In the power conversion device 10 according to the present embodiment, SiC that is a wide band gap semiconductor is employed for the first switching element 22. In general, the production cost of the switching elements 22 and 24 increases in proportion to the size thereof, and the tendency thereof becomes remarkable in the first switching element 22 employing the wide band gap semiconductor. Therefore, in the present embodiment, the size of the first switching element 22 is allowed to be smaller than the size of the second switching element 24 by suppressing the rated current, so that the production cost is reduced. On the other hand, as shown in FIG. 5, as the size of the switching elements 22 and 24 is reduced, the thermal time constant of the switching elements 22 and 24 decreases (that is, the switching element becomes easy to be heated). Therefore, if the size of the first switching element 22 is reduced, the fatigue of the first switching element 22 caused by the thermal history also increases. In addition, as the size of the first switching element 22 is reduced, the intensity of the first switching element 22 decreases, and as a result, it is necessary to increase the size of the first switching element 22. Therefore, in the power conversion device 10 according to the present embodiment is configured so that, as described above, the first switching control and the second switching control are selectively executed according to the current command value, and if the current command value is relatively small, the first switching element 22 is operated. Thus, an excessive current flowing in the first switching element 22 is suppressed. In addition, since the selection between the first switching control and the second switching control is executed on the basis of the current command value, in comparison with a case where the selection is executed on the basis of the instantaneous current, the number of times of fluctuation of the temperature of the first switching element 22 is suppressed, and the fatigue of the first switching element 22 caused by the thermal history is reduced. In addition, that the size of the switching elements 22 and 24 in this specification is intended to be a size when viewed in plan and is also referred to as a chip size, for example.

Figure 6:
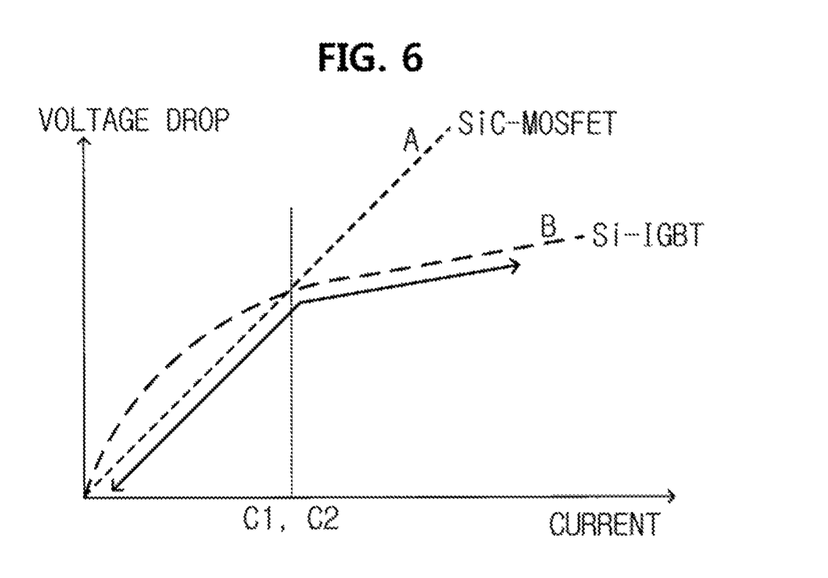
FIG. 6 is a graph showing a relationship between currents and voltage drops (ON voltages) of the switching elements.

FIG. 6 shows a relationship between the currents flowing in the switching elements 22 and 24 and the voltage drop (also referred to as ON voltage) with respect thereto. A graph A in the figure shows the characteristics of the first switching element 22 which is a MOSFET configured by using silicon carbide, and a graph B in the figure shows the characteristics of the second switching element 24 which is an IGBT configured by using silicon. As can be understood from FIG. 6, in a range where the current is relatively small, the energy loss can be suppressed by using the first switching element 22 rather than the second switching element 24. Conversely, in a range where the current is relatively large, the energy loss can be suppressed by using the second switching element 24 rather than the first switching element 22. Regarding this point, in the power conversion device 10 according to the present embodiment, the first switching element 22 is used in a range where the current is relatively small, and the second switching element 24 is used in a range where the current is relatively large, so that the energy loss due to the switching elements 22 and 24 is effectively suppressed. Herein, it is also effective to determine the first threshold value C1 and the second threshold value C2 of the current command value related to the switching of the switching control in accordance with the intersection of the graphs A and B in FIG. 6.

In addition, in many cases, the period during which the power conversion device 10 operates with a large current command value is short, and generally, the first switching control is more selected than the second switching control. For example, in a case where the power conversion device 10 is employed in a car, the power conversion device 10 operates with a large current command value when the driver greatly operates the accelerator pedal. However, the driver greatly operates the accelerator pedal in a short period such as when accelerating from a stopped state, and for other periods such as during cruising, for example, the power conversion device 10 operates with a relatively small current command value. Therefore, even in a case where the first switching control is selected (that is, the first switching element 22 is used) only if the current command value is relatively small, the use frequency of the first switching element 22 becomes relatively high, so that the merit of employing a wide band gap semiconductor can be sufficiently obtained.

Figure 7:
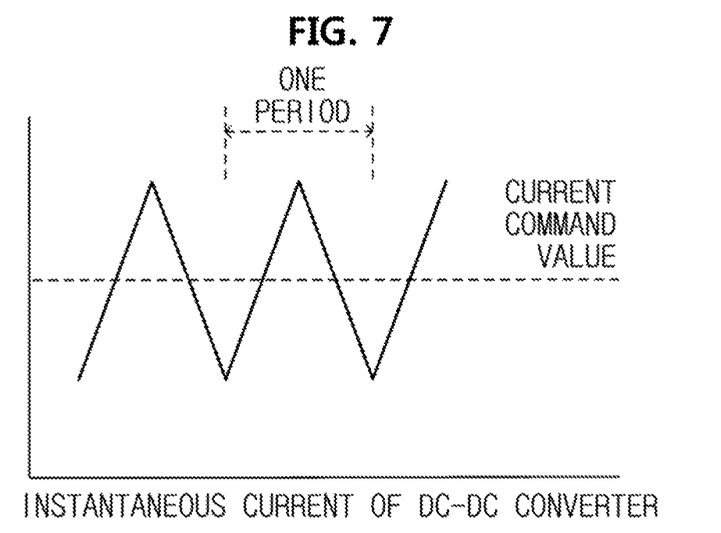
FIG. 7 is a graph schematically showing an instantaneous current of a DC-DC converter.
Figure 8:
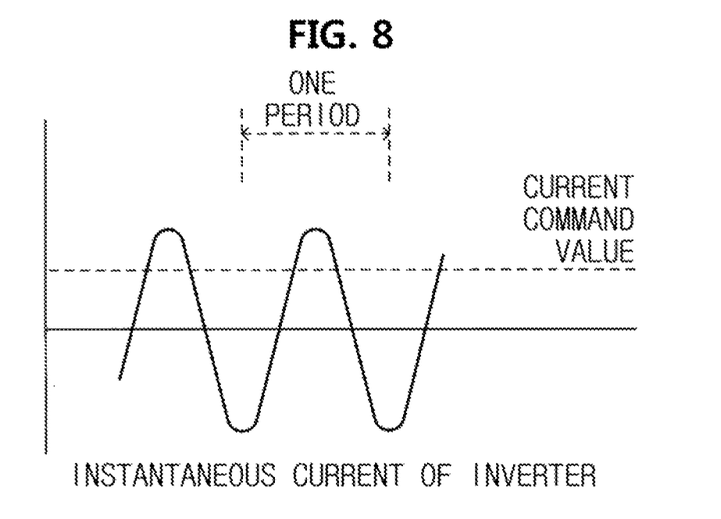
FIG. 8 is a graph schematically showing an instantaneous current of an inverter.

As another embodiment, it may be considered that the selection between the first switching control and the second switching control is executed on the basis of the actual current flowing in the DC-DC converter 12 and the inverter 14. However, as shown in FIG. 7, for example, the actual current (that is, the instantaneous current) flowing in the DC-DC converter 12 greatly fluctuates during one period of the PWM control. Under such circumstances, if the selection between the first switching control and the second switching control is executed on the basis of the instantaneous current flowing in the DC-DC converter 12, the switching between the two switching controls frequently occurs. In this case, since the total number of times of switching of the first switching element 22 and the second switching element 24 increases, the energy loss accompanied with the switching becomes a problem. The same applies to the inverter 14, as shown in FIG. 8, the actual current (that is, the instantaneous current) flowing in the inverter 14 greatly fluctuates during one period of the PWM control. Under such circumstances, if the selection between the first switching control and the second switching control is executed on the basis of the instantaneous current flowing in the inverter 14, the switching between the two switching controls frequently occurs.

Regarding the above points, in the power conversion device 10 according to the present embodiment, the selection between the first switching control and the second switching control is executed on the basis of not the instantaneous value of the current but the current command value. Thus, even in a case where the instantaneous value of the current temporarily increases or decreases, the switching of the switching control is avoided, so that the energy loss accompanied with the increase in the number of times of switching is suppressed. In addition, the control device 16 according to the present embodiment is configured to execute the selection between the first switching control and the second switching control in units of one or a plurality of periods of the PWM control. With such a configuration, it is possible to prohibit the switching of the switching elements 22 and 24 to be turned on during one period of the PWM control. As a result, an increase in the total number of times of switching of the first switching element 22 and the second switching element 24 is avoided, so that it is possible to suppress the energy loss accompanied with the switching. In addition, since the number of times of fluctuation of the temperatures of the first switching element 22 and the second switching element 24 is also suppressed, the fatigue of the first switching element 22 and the second switching element 24 caused by the thermal history is also reduced.

As an example, the first threshold value C1 and the second threshold value C2 of the current command value related to the switching of the switching control may be changed according to the temperature of at least one of the first switching element 22 and the second switching element 24. Specifically, the first threshold value C1 may be changed according to the temperature of the first switching element 22, and the second threshold value C2 may be changed according to the temperature of the second switching element 24. In particular, when the temperature of the first switching element 22 is high, by changing the first threshold value C1 to a smaller value, use of the first switching element 22 can be refrained. Alternatively, when the temperature of the second switching element 24 is high, by changing the second threshold value C2 to a larger value, use of the second switching element 24 can be refrained. With such a configuration, the switching between the first switching control and the second switching control can be appropriately performed while preventing overheating of the first switching element 22 and the second switching element 24.

Alternatively, with respect to the first threshold value C1 and the second threshold value C2 of the current command value related to the switching of the switching control, at least one of the first threshold value C1 and the second threshold value C2 may be used as different values between the switching circuits 20 located in the upper arms 12a, 14a, 14c, and 14e and the switching circuits 20 located in the lower arms 12b, 14b, 14d, and 14f. Additionally or alternatively, at least one of the first threshold value C1 and the second threshold value C2 may be used as different values between at the time of a power-run operation in which the power conversion device 10 supplies power from the battery 2 to the motor 4 and at the time of a regeneration operation in which the power conversion device 10 supplies power from the motor 4 the battery 2.

Figure 9:
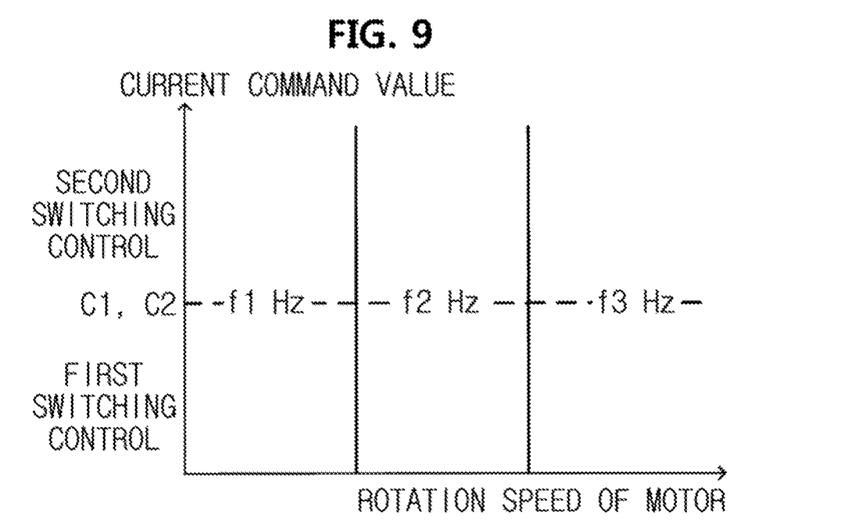
FIG. 9 is a map showing an example of a relationship among a rotation speed of a motor, a current command value, and a carrier frequency.

The carrier frequency (hereinafter, referred to as the first carrier frequency) used in the first switching control and the carrier frequency (hereinafter, referred to as the second carrier frequency) used in the second switching control may be the same as or different from each other. For example, with respect to the inverter 14, as shown in FIG. 9, the first carrier frequency and the second carrier frequency may be changed according to the rotation speed of the motor 4. In addition, in the example shown in FIG. 9, the first carrier frequency and the second carrier frequency are configured to be changed among the three values f1, f2, and f3. Herein, the magnitude relation of the three values f1, f2, and f3 is f1<f2<f3, and each carrier frequency is configured to increase as the rotation speed of the motor 4 increases. With such a configuration, when the rotation speed of the motor 4 is relatively low (that is, the output frequency of the AC power is relatively low), by decreasing each carrier frequency, the switching loss can be suppressed. On the other hand, when the rotation speed of the motor 4 is relatively high (that is, when the output frequency of the AC power is relatively high), by increasing each carrier frequency, an AC power having a smooth waveform can be output.

Figure 10:
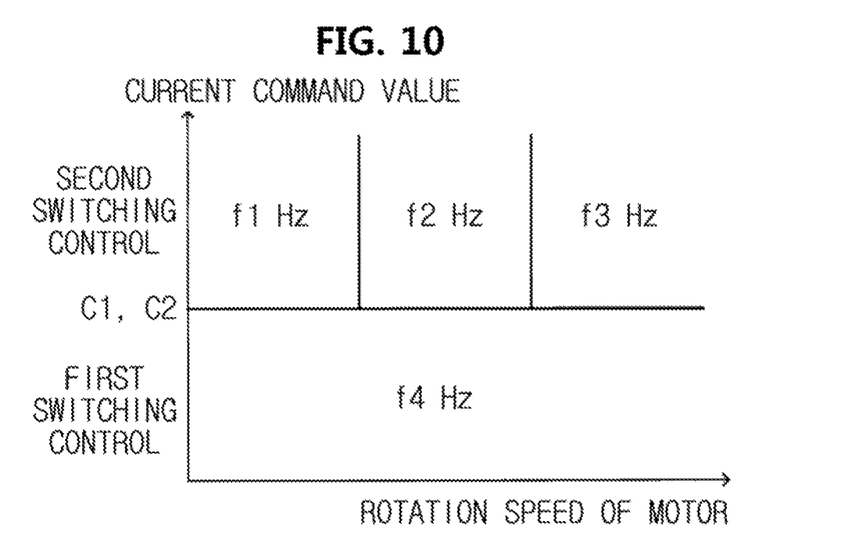
FIG. 10 is a map showing another example of the relationship among the rotation speed of the motor, the current command value, and the carrier frequency.

Alternatively, as shown in FIG. 10, for example, a constant value f4 may be used for the first carrier frequency of the first switching control, irrespective of the rotation speed of the motor 4. With respect to the first switching element 22 of the MOSFET employing silicon carbide, since the switching loss is relatively small, the first carrier frequency can be fixed to a relatively high value, so that it is possible to simplify the control structure. In addition, in another embodiment, not only the first carrier frequency but also the second carrier frequency may be fixed to a constant value so as to further simplify the control structure.

Figure 11:
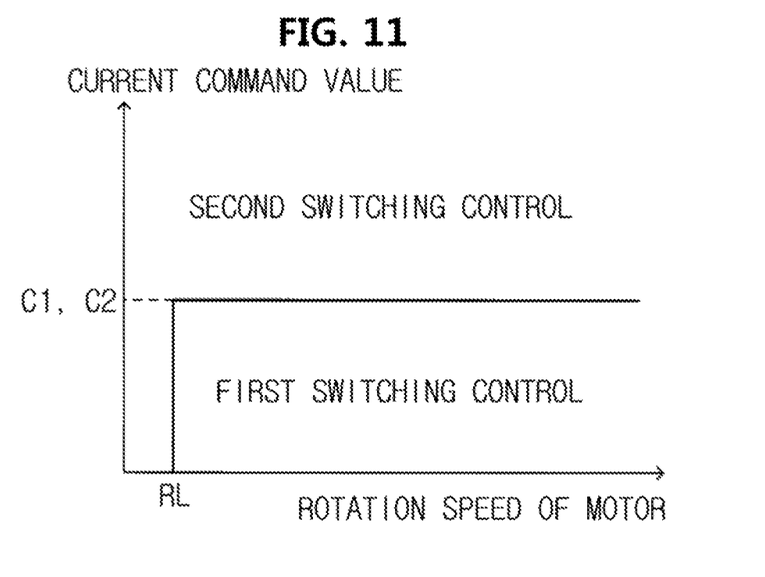
FIG. 11 is a map showing an example of a relationship among the rotation speed of a motor, a current command value, and switching control to be selected.

The power conversion device 10 according to the present embodiment includes the inverter 14. The output frequency of the AC power by the inverter 14 changes according to the rotation speed of the motor 4. When the output frequency of the AC power is small, the current flowing in the switching elements 22 and 24 also gently changes, so that the temperature of the switching elements 22 and 24 tends to greatly fluctuate. In this case, even if the current command value (that is, the effective value of the current) is relatively small, a current larger than the current command value flows over a relatively long period, so that the temperature of the switching elements 22 and 24 may reach a high temperature. For example, in the case of a car, when the wheels are in contact with wheel stoppers or the like so that the wheels are locked, there is a concern that the switching elements 22 and 24 are overheated. Therefore, when the output frequency of the AC power is relatively small, by selecting the second switching control irrespective of the current command value, the operation of the first switching element 22 having a small size (that is, the first switching element 22 having a small thermal time constant) may be prohibited. For example, as shown in FIG. 11, when the rotation speed of the motor 4 falls below a predetermined lower limit value RL, the second switching control may be configured to be selected irrespective of the current command value. Alternatively, as another embodiment, when the rotation speed of the motor 4 falls below the predetermined lower limit value RL during execution of the first switching control, the first carrier frequency may be decreased.

Figure 12:
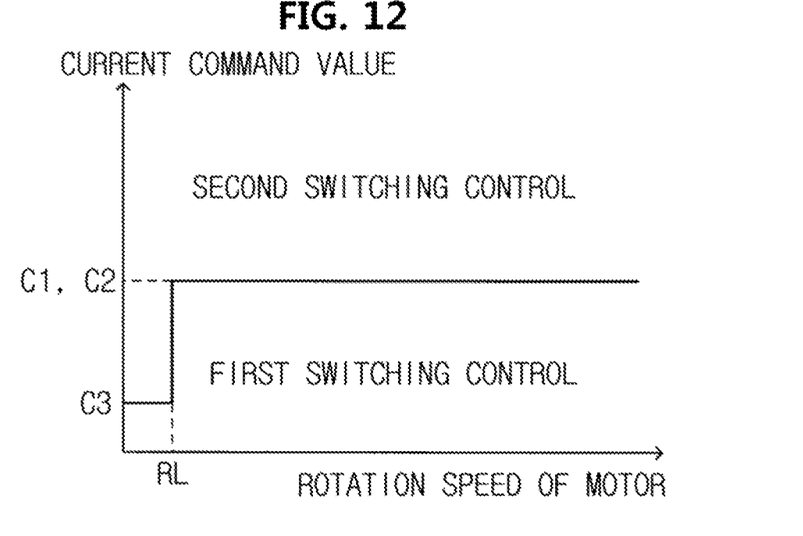
FIG. 12 is a map showing another example of the relationship among the rotation speed of the motor, the current command value, and the switching control to be selected.

Alternatively, as shown in FIG. 12, when the rotation speed of the motor 4 falls below the predetermined lower limit value RL, the first switching control may be configured to be selected only if the current command value falls below the third threshold value smaller than the first threshold value C1 or the second threshold value C2. In addition, but not limited to the example shown in FIG. 12, the threshold values C1 and C2 of the current command values related to the switching between the first switching control and the second switching control may be variously changed according to the rotation speed of the motor 4.

In the power conversion device 10 according to the present embodiment, each switching circuit 20 includes one first switching element 22 and one second switching element 24. However, as another embodiment, the switching circuit 20 may include a plurality of first switching elements 22 or may include a plurality of second switching elements 24. In this case, the plurality of first switching elements 22 or the plurality of second switching elements 24 may be connected in parallel with each other. In addition, in the power conversion device 10 according to the present embodiment, the inverter 14 is a three-phase inverter, but the number of phases of the inverter 14 or the motor 4 is not particularly limited.

Although several specific examples have been described in detail above, these are merely illustrative and do not limit the scope of the claims. The technologies disclosed in the claims include those in which the specific examples exemplified above are variously modified and changed. The technical elements described in this specification or the drawings will exhibit technical usefulness singly or in various combinations.

What is claimed is:

1. A power conversion device configured to perform power conversion between a power source and a load, the power conversion device comprising:
    a first switching element provided on a power supply path from the power source to the load and configured by using a first semiconductor material;
    a second switching element connected in parallel with the first switching element and configured by using a second semiconductor material having a band gap narrower than that of the first semiconductor material; and
    a control device configured to selectively execute any one of first switching control and second switching control, where the first switching control is control of intermittently turning on the first switching element according to a current command value, and the second switching control is control of intermittently turning on the second switching element according to the current command value;
    wherein a size of the first switching element is smaller than a size of the second switching element, and
    wherein the control device is configured to select the first switching control if the current command value is smaller than a first threshold value and to select the second switching control if the current command value is larger than a second threshold value.

2. The power conversion device according to claim 1, wherein the control device is configured to execute selection of the first switching control or the second switching control in units of a period of the first switching control or the second switching control.

3. The power conversion device according to claim 1, wherein the second threshold value is larger than the first threshold value, and
    wherein the control device is configured so that:
    when executing the first switching control, the control device proceeds to the second switching control if the current command value exceeds the second threshold value, and
    when executing the second switching control, the control device proceeds to the first switching control if the current command value falls below the first threshold value.

4. The power conversion device according to claim 1, wherein the control device is configured to change at least one of the first threshold value and the second threshold value according to a temperature of at least one of the first switching element and the second switching element.

5. The power conversion device according to claim 1, wherein the control device is configured so that:
    in the first switching control, PWM control is performed on the first switching element at a first carrier frequency; and
    in the second switching control, PWM control is performed on the second switching element at a second carrier frequency.

6. The power conversion device according to claim 5, wherein the first carrier frequency in the first switching control and the second carrier frequency in the second switching control have the same value.

7. The power conversion device according to claim 6, further comprising an inverter configured to output an AC power, wherein the control device is configured to change at least one of the first carrier frequency and the second carrier frequency according to an output frequency of the AC power.

8. The power conversion device according to claim 6, further comprising an inverter configured to output an AC power, wherein the control device is configured to select the second switching control even if the current command value is smaller than the first threshold value when an output frequency of the AC power is less than a predetermined lower limit value.

9. The power conversion device according to claim 5, wherein the first carrier frequency in the first switching control is different from the second carrier frequency in the second switching control.

10. The power conversion device according to claim 1, wherein the first semiconductor material is silicon carbide (SiC), and the second semiconductor material is silicon (Si).

11. The power conversion device according to claim 1, wherein the first switching element is a MOSFET, and the second switching element is an IGBT.

* * * * *